(12) United States Patent
Hafez et al.

(10) Patent No.: US 10,002,954 B2
(45) Date of Patent: Jun. 19, 2018

(54) FIN-BASED SEMICONDUCTOR DEVICES AND METHODS

(71) Applicants: Walid M. Hafez, Portland, OR (US); Chia-Hong Jan, Portland, OR (US)

(72) Inventors: Walid M. Hafez, Portland, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/100,286

(22) PCT Filed: Jan. 24, 2014

(86) PCT No.: PCT/US2014/013008
§ 371 (c)(1),
(2) Date: May 27, 2016

(87) PCT Pub. No.: WO2015/112163
PCT Pub. Date: Jul. 30, 2015

(65) Prior Publication Data
US 2017/0005187 A1    Jan. 5, 2017

(51) Int. Cl.
*H01L 29/66* (2006.01)
*H01L 29/74* (2006.01)
(Continued)

(52) U.S. Cl.
CPC .......... *H01L 29/74* (2013.01); *H01L 21/2255* (2013.01); *H01L 27/0262* (2013.01);
(Continued)

(58) Field of Classification Search
None
See application file for complete search history.

(56) References Cited

U.S. PATENT DOCUMENTS 4,510,016 A * 4/1985 Chi ................... H01L 29/66424
257/586
4,648,173 A * 3/1987 Malaviya ............ H01L 21/0337
257/517

(Continued)

FOREIGN PATENT DOCUMENTS

WO      2010/104918 A1    9/2010
WO      2013/095645 A1    6/2013

OTHER PUBLICATIONS

International Search Report and Written Opinion, dated Oct. 24, 2014, issued in corresponding International Application No. PCT/US2014/013008, 11 pages.

(Continued)

*Primary Examiner* — Eric Ward
(74) *Attorney, Agent, or Firm* — Schwabe, Williamson & Wyatt, P.C.

(57) ABSTRACT

Embodiments of semiconductor devices, integrated circuit devices and methods are disclosed. In some embodiments, a semiconductor device may include a first fin and a second fin disposed on a substrate. The first fin may have a portion including a first material disposed between a second material and the substrate, the second material disposed between a third material and the first material, and the third material disposed between a fourth material and the second material. The first and third materials may be formed from a first type of extrinsic semiconductor, and the second and fourth materials may be formed from a second, different type of extrinsic semiconductor. The second fin may be laterally separated from the first fin and materially contiguous with at least one of the first, second, third or fourth materials. Other embodiments may be disclosed and/or claimed.

20 Claims, 11 Drawing Sheets

(51) Int. Cl.
*H01L 29/417* (2006.01)
*H01L 29/06* (2006.01)
*H01L 27/02* (2006.01)
*H01L 21/225* (2006.01)
*H01L 29/78* (2006.01)

(52) U.S. Cl.
CPC .... *H01L 29/0649* (2013.01); *H01L 29/41716* (2013.01); *H01L 29/66363* (2013.01); *H01L 29/785* (2013.01)

(56) References Cited

U.S. PATENT DOCUMENTS

| | | | | |
|---|---|---|---|---|
| 4,829,357 | A * | 5/1989 | Kasahara | G02F 3/026 257/113 |
| 6,104,045 | A * | 8/2000 | Forbes | H01L 27/1027 257/140 |
| 6,894,351 | B2 * | 5/2005 | Okawa | H01L 27/0262 257/122 |
| 6,913,955 | B1 | 7/2005 | Horch et al. | |
| 6,936,886 | B2 * | 8/2005 | Noble, Jr. | G11C 11/39 257/314 |
| 7,078,739 | B1 | 7/2006 | Nemati et al. | |
| 7,397,109 | B2 * | 7/2008 | Bromberger | H01L 21/8222 257/197 |
| 7,560,784 | B2 * | 7/2009 | Cheng | H01L 29/0649 257/401 |
| 8,130,537 | B2 * | 3/2012 | Weis | G11C 13/0004 365/163 |
| 8,519,431 | B2 * | 8/2013 | Nemati | H01L 27/0817 257/110 |
| 8,598,621 | B2 * | 12/2013 | Tang | H01L 27/1027 257/115 |
| 2004/0027743 | A1 | 2/2004 | Higashi et al. | |
| 2005/0263763 | A1 | 12/2005 | Bhattacharyya | |
| 2009/0184358 | A1 | 7/2009 | Lenoble et al. | |
| 2011/0034001 | A1 * | 2/2011 | Nuttinck | H01L 29/66242 438/311 |
| 2013/0026562 | A1 | 1/2013 | Beigel et al. | |
| 2013/0168732 | A1 | 7/2013 | Lin et al. | |
| 2013/0187235 | A1 | 7/2013 | Huang et al. | |
| 2013/0229223 | A1 | 9/2013 | Shrivastava et al. | |
| 2013/0280883 | A1 | 10/2013 | Faul et al. | |
| 2013/0329499 | A1 * | 12/2013 | Lee | H01L 27/11563 365/185.17 |

OTHER PUBLICATIONS

Taiwan Office Action and Search Report dated Mar. 9, 2016, issued in corresponding Taiwan Patent Application No. 103144803.
Auth, C., et al.,"A 22nm High Performance and Low-Power CMOS Technology Featuring Fully-Depleted Tri-Gate Transistors, Self-Aligned Contacts and High Density MIM Capacitors," VLSI Technology (VLSIT), 2012 Symposium, Jun. 12-14, 2012, pp. 131-132.
Kulkarni, S., H., et al.,"A 32nm High-k and Metal-Gate Anti-Fuse Array Featuring a 1.01 μm2 1T1C Bit Cell," 2012 Symposium on VLSI Technology Digest of Technical Papers, 978-1-4673-0847-2/12/$31.00 © 2012 IEEE, pp. 79-80.
Jan C.-H., et al., "A 32nm SoC Platform Technology with 2nd Generation High-k/Metal Gate Transistors Optimized for Ultra Low Power, High Performance, and High Density Product Applications," 2009 IEEE International Electron Devices Meeting (IEDM), Dec. 7-9, 2009, pp. 1-4.
International Preliminary Report on Patentability, dated Aug. 4, 2016, issued in corresponding International Application No. PCT/US2014/013008, 8pages.
Office Action in Primary Examination (including Search Report) dated Jul. 11, 2017, issued in related Taiwan Patent Application No. 106100873, 17 pages.
Extended European Search Report dated Jul. 19, 2017, issued in related European Patent Application No. EP 14 87 9976, 10 pages.

* cited by examiner

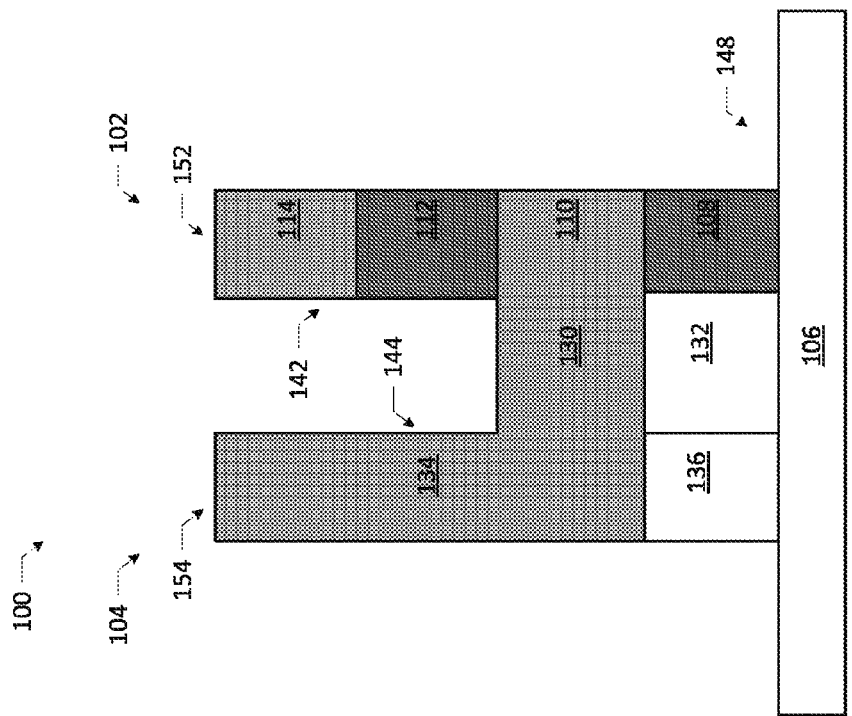
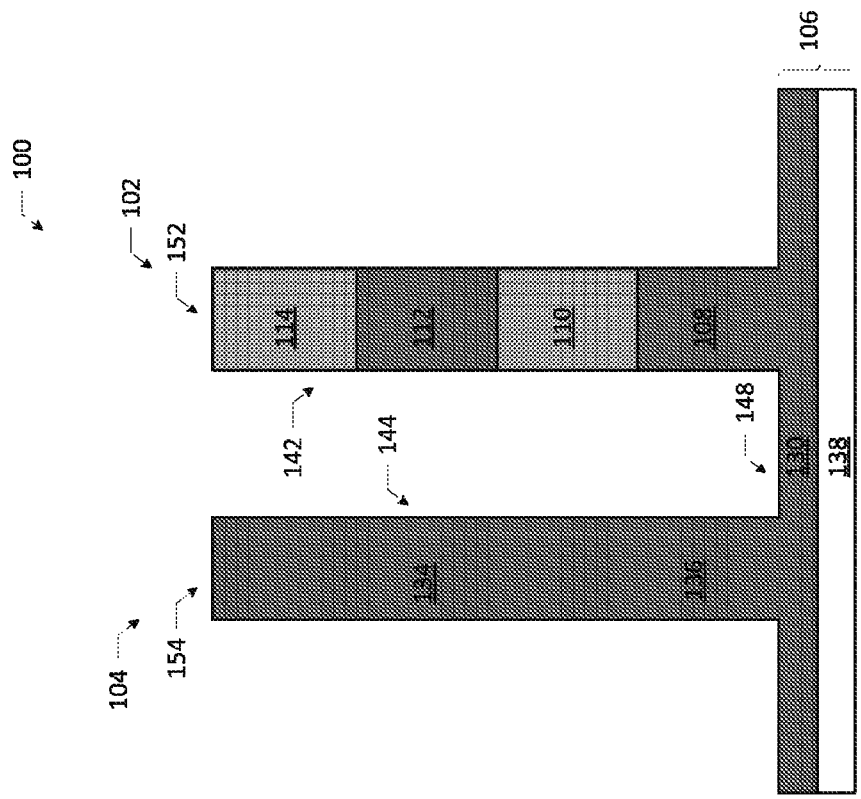

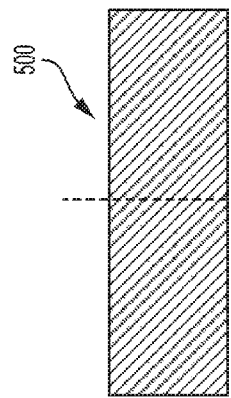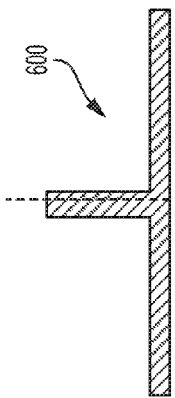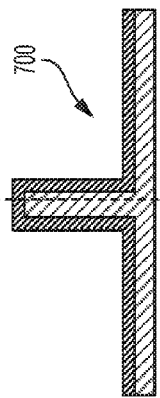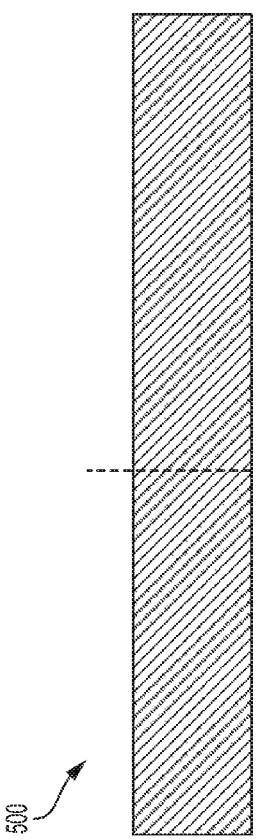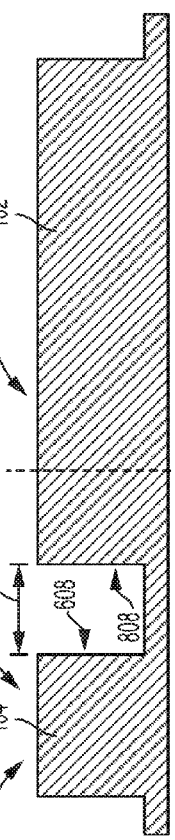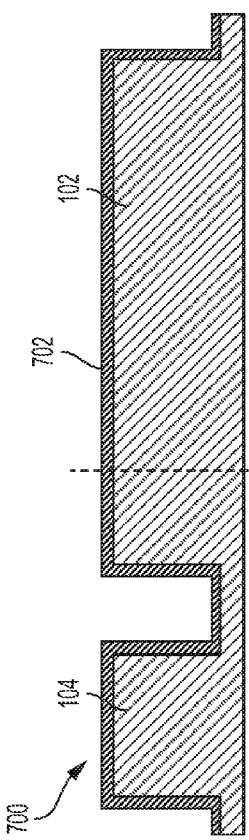

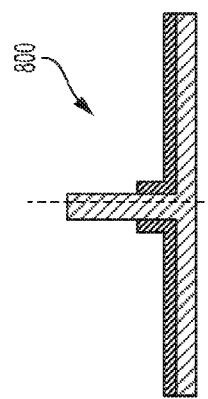
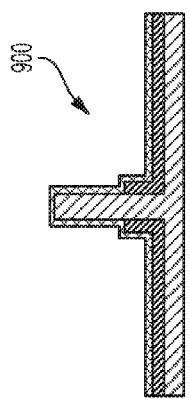
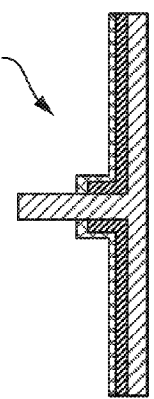
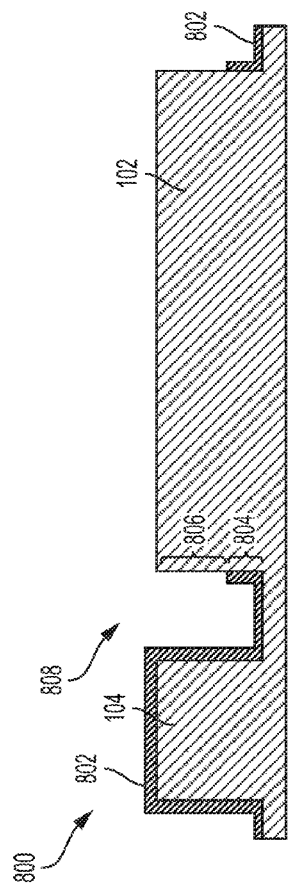
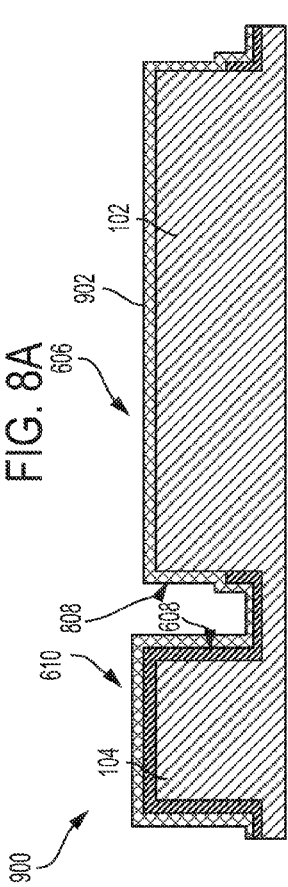
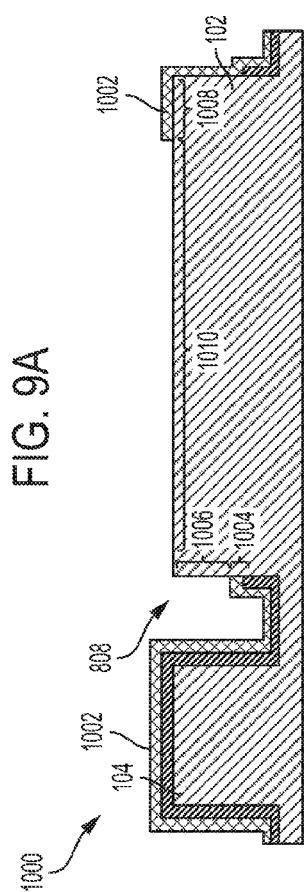

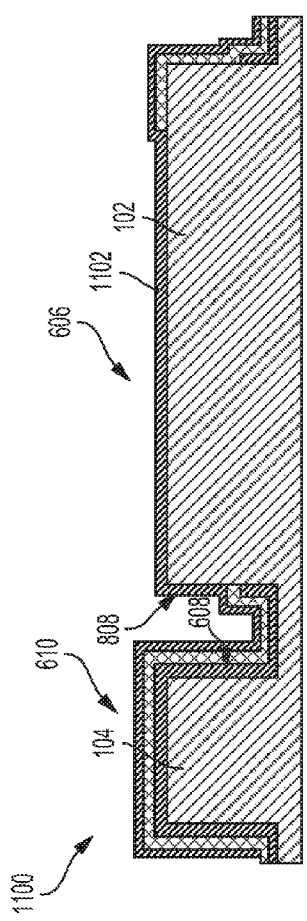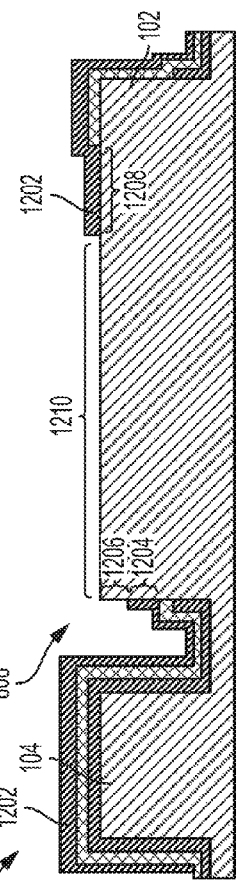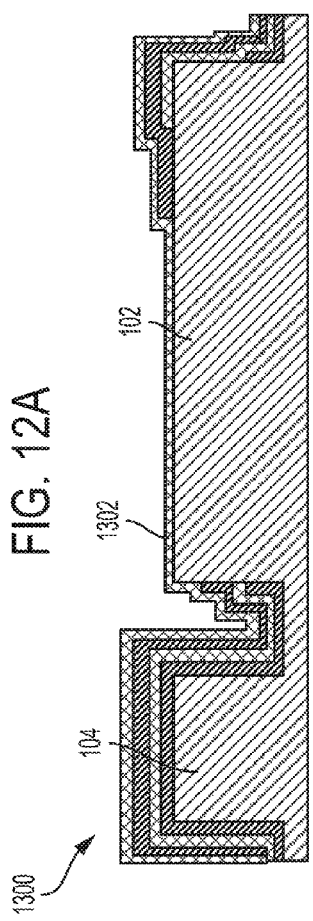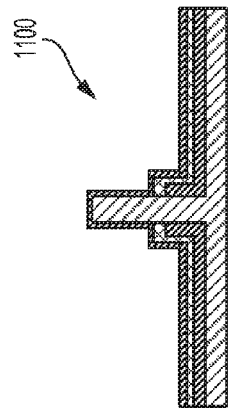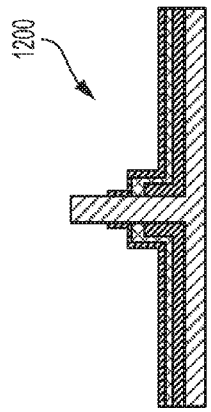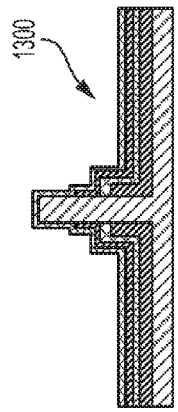

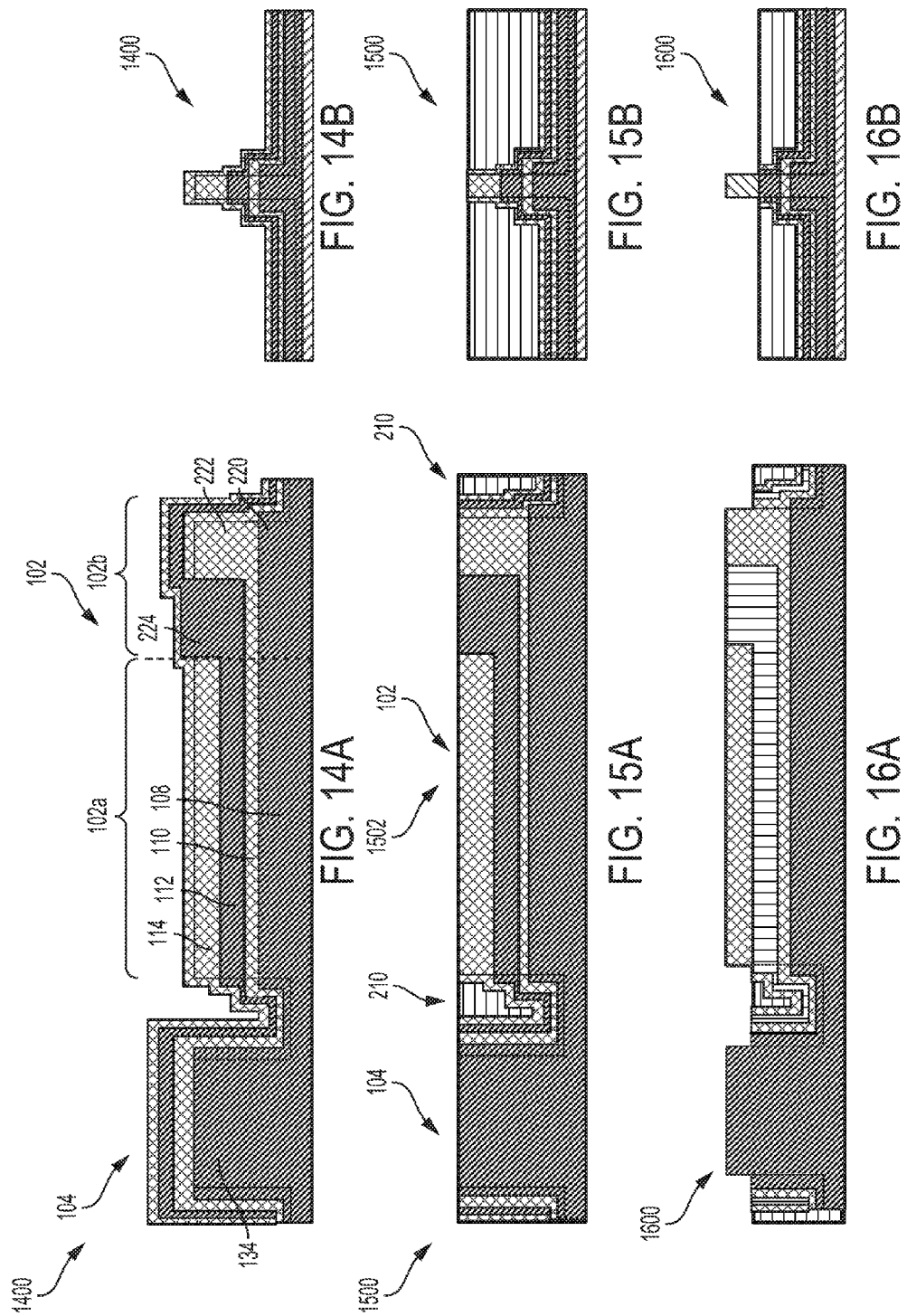

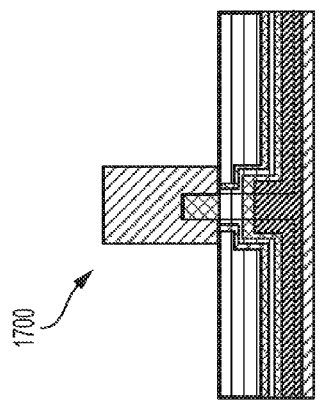
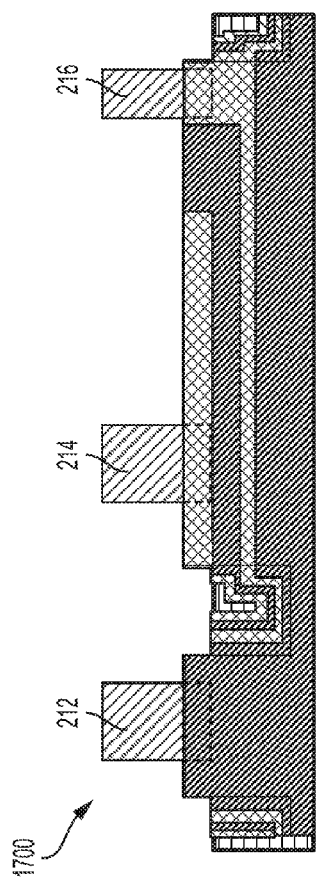
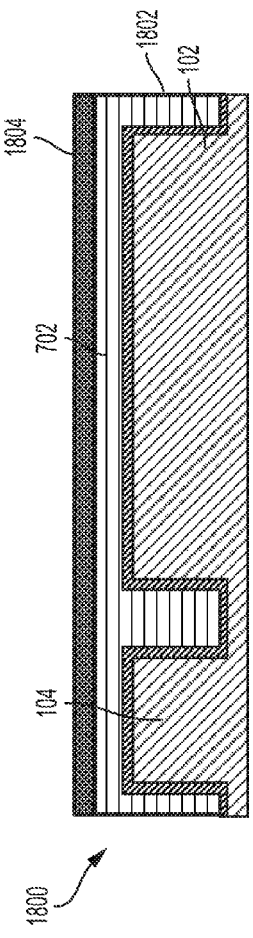
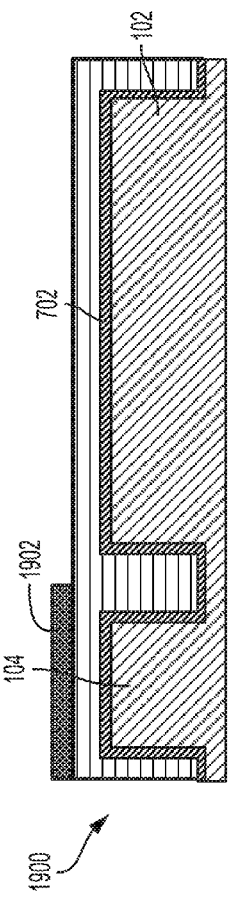

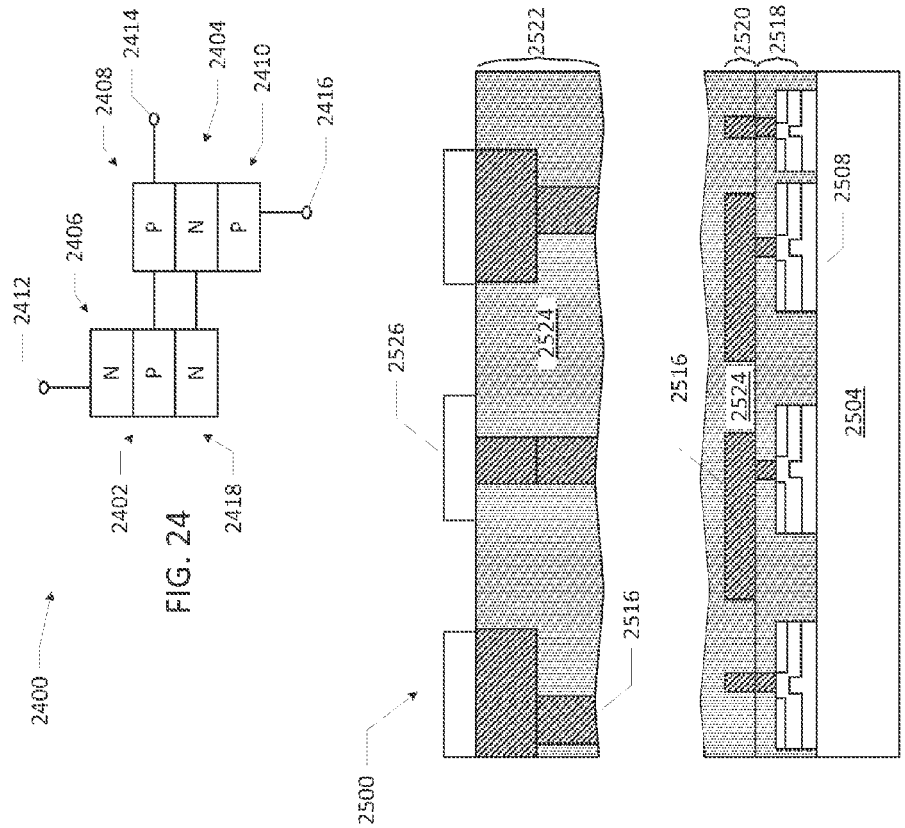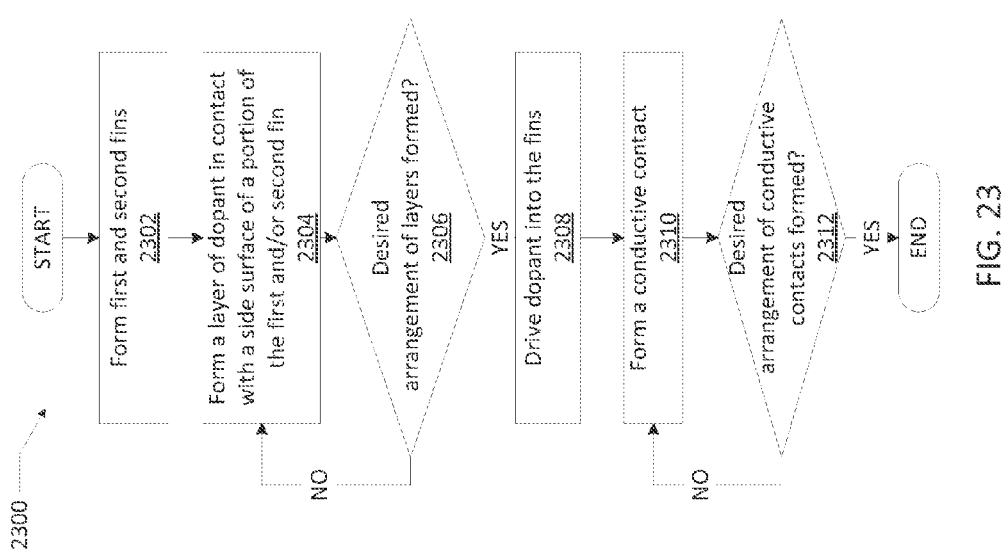

US 10,002,954 B2

FIN-BASED SEMICONDUCTOR DEVICES AND METHODS

CROSS-REFERENCE TO RELATED APPLICATION

The present application is a national phase entry under 35 U.S.C. § 371 of International Application No. PCT/US2014/013008, filed Jan. 24, 2014, entitled "FIN-BASED SEMICONDUCTOR DEVICES AND METHODS," which designates the United States of America, the entire disclosure of which is hereby incorporated by reference in its entirety and all purposes.

FIELD

Embodiments of the present disclosure generally relate to the field of semiconductor devices, and more particularly, to fin-based semiconductor devices and methods.

BACKGROUND

Some existing integrated circuit (IC) devices include one or more silicon controlled rectifiers (SCRs) at the junction level of the device. These SCRs are typically fabricated using ion implantation to form N- and P-type materials arranged substantially laterally along the surface of a silicon substrate. Such SCRs have a large footprint that is not readily scaled because the junction gaps are subject to the minimum distances imposed by conventional lithography, as well as the limited precision achievable with ion implantation. Consequently, existing SCRs and other planar semiconductor devices may be inadequate as IC feature sizes continue to shrink.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1-4 are cross-sectional views of various semiconductor devices, in accordance with some embodiments.

FIGS. 5-17 illustrate various stages in the fabrication of a semiconductor device, in accordance with some embodiments.

FIGS. 18-21 illustrate various stages in patterning operations in the fabrication of a semiconductor device, in accordance with some embodiments.

FIG. 23 is a flow diagram of a method of fabricating a semiconductor device, in accordance with some embodiments.

FIG. 24 is a physical diagram of an embodiment of a semiconductor device configured as a thyristor.

FIG. 25 is a cross-sectional view of a portion of an integrated circuit device including semiconductor devices at the device layer, in accordance with some embodiments.

DETAILED DESCRIPTION

Figure 3:
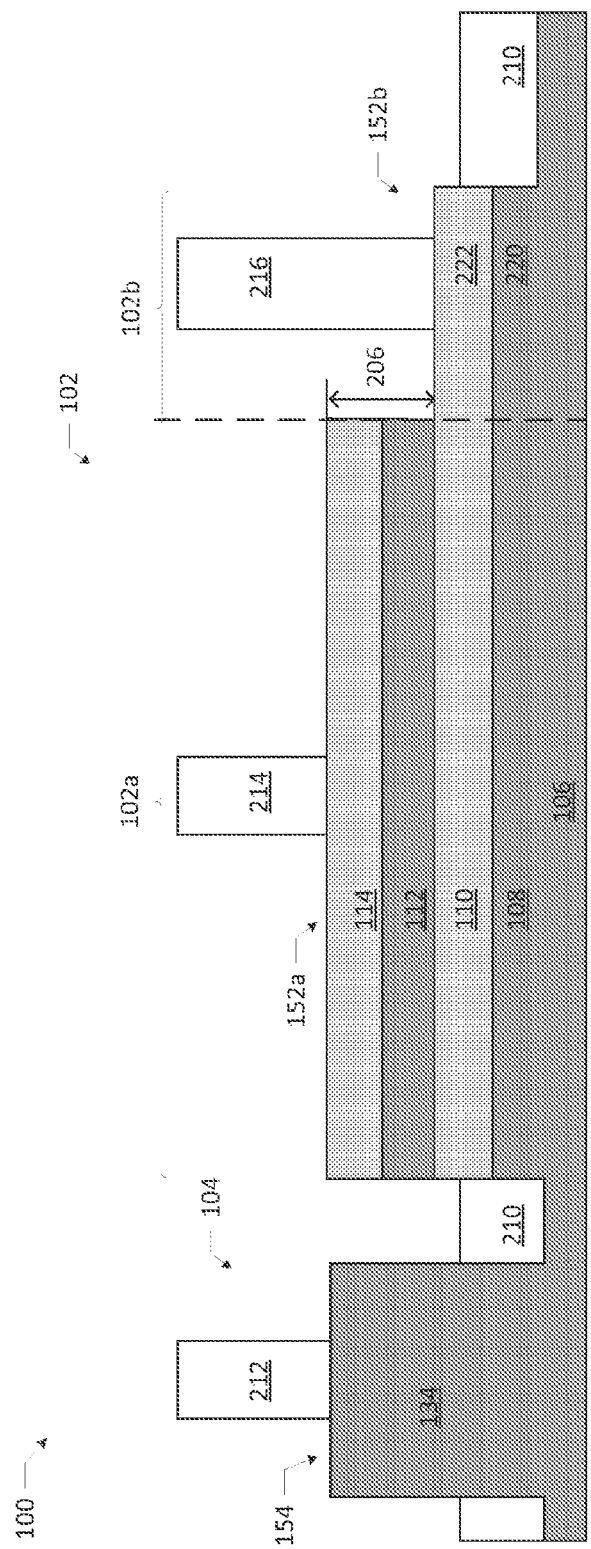

Embodiments of the present disclosure describe fin-based semiconductor devices and methods for their fabrication and use in integrated circuit (IC) devices. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, vertical/horizontal, above/below and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

FIGS. 1-4 are cross-sectional views of embodiments of a semiconductor device 100. The semiconductor device 100 may be formed at the device layer (e.g., at the junction level) of an IC device, for example. Each semiconductor device 100 may include a first fin 102 and a second fin 104. The first fin 102 and the second fin 104 may be disposed on a substrate 106. The substrate 106 may be any substrate known in the art to be suitable for forming a semiconductor device, such as, but not limited to, a semiconductor substrate, semiconductor-on-insulator (SOI) substrate, an insulator substrate (e.g., sapphire), and/or any combination thereof. In some embodiments, the substrate 106 includes a substantially monocrystalline semiconductor, such as, but not limited to, silicon. In FIG. 1, the substrate 106 may include a material 130 (which may be an extrinsic semiconductor, such as a doped silicon, as discussed below) and a material 138 (which may be silicon or another substrate material).

The first fin 102 and/or the second fin 104 may take a wide variety of structural forms and dimensions. In some embodiments, the first fin 102 and the second fin 104 may include side surfaces 142 and 144, respectively, that are non-parallel to a plane of a top surface 148 of the substrate 106 and top surfaces 152 and 154, respectively, that may be rounded or substantially planar with the top surface 148 of the substrate 106.

The first fin 102 may include a first material 108, a second material 110, a third material 112 and a fourth material 114. The first material 108 may be disposed between the second material 110 and the substrate 106. The second material 110 may be disposed between the third material 112 and the first material 108. The third material 112 may be disposed between the fourth material 114 and the second material 110.

In some embodiments, the first material 108 and the third material 112 may be formed from a type of extrinsic semiconductor. As used herein, an "extrinsic semiconductor" may refer to a semiconductor into which a dopant has been introduced to change the electron and hole concentration of the semiconductor. As used herein, a "type" of extrinsic semiconductor may refer to whether the extrinsic semiconductor has a larger electron concentration than hole concentration (referred to as an "N-type semiconductor" or "N-type") or has a larger hole concentration than electron concentration (referred to as a "P-type semiconductor" or "P-type"). In some embodiments, the first material 108 and the third material 112 may be formed from an N-type semiconductor; in other embodiments, the first material 108 and the third material 112 may be formed from a P-type semiconductor. Similarly, a dopant may be referred to as a dopant "for" a particular extrinsic semiconductor type depending upon whether the dopant provides electrons (acting as a dopant for an N-type extrinsic semiconductor) or holes (acting as a dopant for a P-type of extrinsic semiconductor).

Any desired dopants may be used herein. For example, in some embodiments, the first fin 102 and the second fin 104 may be formed from a Group IV semiconductor compositions (e.g., silicon or germanium); in such embodiments, example P-type dopants may include Group III acceptors (e.g., boron or gallium), and example N-type dopants may include Group V donors (e.g., phosphorous or arsenic). In some, embodiments, a dopant may be a doped glass, such as borosilicate glass, phosphosilicate glass, or other doped glasses.

In some embodiments, the second material 110 and the fourth material 114 may be formed from a type of extrinsic semiconductor different from the type used to form the first material 108 and the third material 112. For example, if the first material 108 and the third material 112 are formed from a P-type semiconductor, the second material 110 and the fourth material 114 may be formed from an N-type semiconductor, and vice versa. Adjacent materials having different types may provide NP junctions, which may be arranged in any desired manner to form a semiconductor device 100. For example, in some embodiments, the semiconductor device 100 may include an NPNP or PNPN junction stack (provided by the "stack" of the first material 108, the second material 110, the third material 112 and the fourth material 112) arranged vertically along the first portion 102a of the first fin 102.

The second fin 104 may be laterally separated from the first fin 102 on the substrate 106, and may have a material 134 that is materially contiguous with at least one of the first material 108, the second material 110, the third material 112 and the fourth material 114. As used herein, two materials may be "materially contiguous" if there is an electrically continuous pathway through a common type of semiconductor between the materials.

Figure 4:
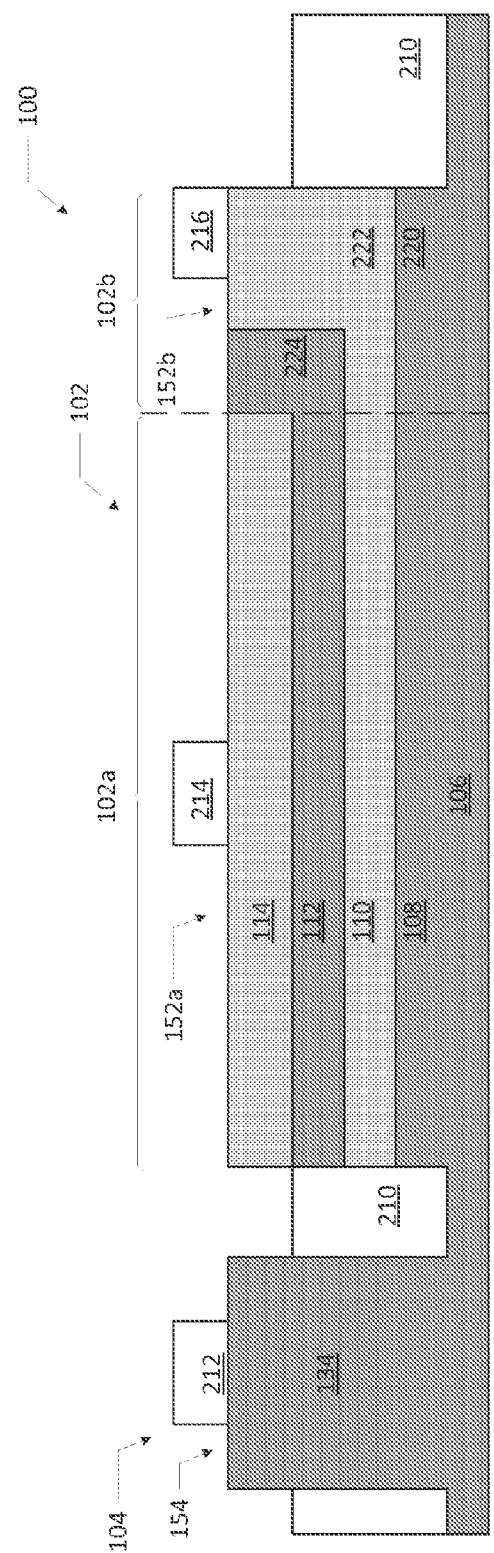

In some embodiments, two materials may be materially contiguous if they are formed from a same material and are adjacent or have another portion of the same material between them. In some embodiments, a fin may only include a single material, which may encompass substantially all of the fin. For example, in the embodiments of FIGS. 1, 3 and 4, the material 134 of the second fin 104 may encompass substantially all of the second fin 104. In the embodiment of FIG. 2, the second fin may include a material 136 (which may be formed of the same material as the substrate 106, or any other material) between the material 134 and the substrate 106. In FIGS. 1, 3 and 4, the material 134 may be materially contiguous with the first material 108 of the first fin 102 (via the bridging portion 130, which may be formed of the same type of extrinsic semiconductor as the first material 108 and the material 134 and may be formed by, e.g., solid source diffusion, as discussed below). In FIG. 2, the material 134 may be materially contiguous with the second material 110 of the first fin 102 (via the bridging portion 130, which may be formed of the same type of extrinsic semiconductor as the second material 110 and the material 134, and which may be supported by an insulator material 132).

In some embodiments, the semiconductor device 100 may include one or more conductive contacts. For example, in the embodiments of FIGS. 3 and 4, a conductive contact 212 may be disposed on the material 134 of the second fin 104, a conductive contact 214 may be disposed on the fourth material 114 of the first fin 102, and a conductive contact 216 may be disposed on the second material 110 of the first fin 102.

In some embodiments, the first fin 102 of the semiconductor device 100 may include a first portion and a second portion. Examples of such embodiments are depicted in FIGS. 3 and 4, in which the first portion 102a and the second portion 102b of the first fin 102 are disposed laterally in some embodiments, the first material 108, the second material 110, the third material 112 and the fourth material 114 may be included in the first portion 102a, and other materials may be included in the second portion 102b. For example, in the embodiment of FIG. 3, the second portion 102b may include a first material 220 and a second material 222. In the embodiment of FIG. 4, the second portion 102b may include a first material 220, a second material 222, and a third material 224.

In some embodiments, one or more materials of the second portion 102b may be materially contiguous with one or more materials of the first portion 102a. For example, as shown in FIG. 3, the first material 108 and the second material 110 of the first portion 102a may be materially contiguous with the first material 220 and the second material 222, respectively, of the second portion 102b. As shown in FIG. 4, the first material 108, the second material 110, and the third material 112 of the first portion 102a may be materially contiguous with the first material 220, the second material 222, and the third material 224, respectively, of the second portion 102b. Materials included in the second portion 102b may be arranged similar to or differently than materials in the first portion 102a. For example, as shown in FIG. 4, the first material 108 of the first portion 102a and the first material 220 of the second portion 102b may be substantially planar. The second material 110 in the first portion 102a may be substantially planar, but the second material 222 of the second portion 102b may have a different geometry (namely, different thicknesses within the second portion 102b). The third material 112 in the first portion 102a may be arranged substantially linearly, but the third material 224 of the second portion 102b may have a different geometry (namely, thicker in the second portion 102b than in the first portion 102a, and disposed above some of the second material 222 in the second portion 102b and laterally with respect to some of the second material 222 in the second portion 102b).

In some embodiments, the fourth material 114 of the first portion 102a and the second material 222 of the second portion 102b may be laterally separated by a material that is materially contiguous with the third material 112 of the first portion 102a. Such an embodiment is illustrated in FIG. 4, in which the third material 224 of the second portion 102b laterally separates the fourth material 114 of the first portion 102 and the second material 222 of the second portion 102b, and is materially contiguous with the third material 112 of the first portion 102a.

As noted above, in some embodiments, the semiconductor device 100 may include an NPNP or PNPN junction stack (provided by the "stack" of the first material 108, the second material 110, the third material 112 and the fourth material 114) arranged vertically along the first portion 102a of the first fin 102. The second fin 104 and the second portion 102b of the first fin 102 may each include a material that is materially contiguous with at least one of the NPNP or PNPN materials, and may provide a surface on which a conductive contact may be disposed for electrical contact with a desired material in the NPNP or PNPN junction stack. For example, a conductive contact 212 may be disposed on the material 134 of the second fin 104 to provide electrical access to the first material 108, and a conductive contact 216 may be disposed on the second material 222 of the second portion 102b of the first fin 102 to provide electrical access to the second material 110. The second fin 104 and the second portion 102b of the first fin 102 may thus serve as conduits for electrical connection to various materials in the first portion 102a.

In some embodiments, a surface 152a of the first portion 102a may be in a same plane or a different plane than a surface 152b of the second portion 102b. For example, FIG. 3 depicts an embodiment of the semiconductor device 100 in which the surface 152a and the surface 152b are not in a same plane (and are instead separated by a distance 206). FIG. 4 depicts an embodiment of the semiconductor device 100 in which the surface 152a and the surface 152b are substantially in the same plane.

In some embodiments, the second fin 104 may be laterally separated from the first fin 102 by an insulator. For example, in FIGS. 3 and 4, the first fin 102 may be laterally separated from the second fin 104 by the insulator 210. In some embodiments, the insulator 210 may include an isolation dielectric such as, but not limited, to, one or more layers of one or more of silicon dioxide, silicon oxynitride, or silicon nitride.

Although FIGS. 1-4 depict semiconductor devices 100 having a portion of a first fin with four alternating types of semiconductors, various embodiments of the semiconductor device 100 may include more or fewer materials having various types and arrangements. For example, some embodiments of the semiconductor device 100 may include three alternating materials. Three alternating materials (such as "NPN" or "PNP" structures) may be used to form bipolar junction transistors (BJTs). In some embodiments, regions of low or intrinsic doping can be inserted in a P-type/insulator/N-type ("PIN") configuration for use in high voltage or optical applications. Some embodiments of the semiconductor device 100 may include five alternating materials. For example, PNPNP or NPNPN configurations may be useful in electrostatic discharge protection devices.

In some embodiments, a semiconductor device 100 may have an "NPNP" or "PNPN" arrangement of materials, and may be used as a thyristor (also sometimes referred to as a "silicon controlled rectifier" or "SCR"). A physical diagram of a thyristor is shown in the physical diagram of FIG. 24, in which the thyristor 2400 may be modeled as a pair of transistors: an NPN transistor 2402 and a PNP transistor 2404. The thyristor 2400 may have a cathode 2406 (and corresponding contact 2412), a gate 2408 (and corresponding contact 2414), an N-type material 2418, and an anode 2410 (and corresponding contact 2416). When a small voltage is applied between the gate 2408 and the cathode 2406, the NPN transistor 2402 may be turned on by the resulting current, which may turn on the PNP transistor 2404. The current through the PNP transistor 2404 may supply the NPN transistor 2402 with current, such that the NPN transistor 2402 remains on without an applied voltage at the gate 2408. In some embodiments, the first material 108 may serve as the cathode 2406, the second material 110 may serve as the gate 2408, the third material 112 may serve as the N-type material 2418, and the fourth material 114 may serve as the anode 2410. In some embodiments, the conductive contact 212 of FIGS. 3-4 may serve as the contact 2412, the conductive contact 212 may serve as the contact 2414, and the conductive contact 216 may serve as the contact 2416.

In some embodiments, a semiconductor device 100 formed as a thyristor may be used in electrostatic discharge protection circuitry (e.g., a high voltage clamping mechanism) in an IC device. Thyristors may be particularly useful in system-on-a-chip (SoC) architectures to sink high current spikes that might otherwise damage small IC devices, but may be used in other protective applications (e.g., whenever a contact pin is exposed to the external environment, and therefore requires electrostatic discharge protection). Thyristors and other rectifiers may also be used in various voltage control applications.

Thyristors and other rectifiers and other semiconductor devices formed in accordance with the techniques disclosed herein may have a number of advantages over existing SCRs used in IC devices. As noted above, in some existing planar complementary metal oxide semiconductor (CMOS) processes, SCRs are typically constructed with the N- and P-type materials arranged substantially laterally along the surface of a silicon substrate. Such SCRs have a large footprint because the N- and P-type materials must be distributed laterally. This footprint is not readily scaled down because the laterally separated N- and P-type materials must be spaced apart within the silicon to form the desired NP junctions, and this spacing is subject to the minimum distances imposed by conventional lithography. Additionally, existing SCRs are often fabricated by using an ion implantation technique to implant dopants into a silicon substrate. Driving dopants into the silicon typically requires high energy particles that exhibit substantial lateral and vertical "straggle" and therefore cannot be precisely placed within the silicon. Consequently, the precision (and therefore, the minimum achievable feature size) of structures formed via ion implantation may be limited. Lithographic bias and penetration, combined with straggle, may also impact the dopant distribution of the implanted ion and thereby influence the location of the intended junction, which may add additional variation to the implanted ion (and junction) location.

Thyristors and other semiconductor devices formed using the fin-based arrangements and techniques disclosed herein may provide compact, scalable devices that may be readily incorporated into fin field effect transfer (FinFET) and other manufacturing process flows. In some embodiments, solid source diffusion techniques may be advantageously used in the fabrication of the fin-based semiconductor device described herein. As discussed below, solid source diffusion techniques may allow the dimensions of doping in each material of the semiconductor device 100 to be more precisely controlled than possible using ion implantation techniques. In particular, solid source diffusion may enable more precise control of the NP junction depths and the amount of doping, thereby minimizing variation between semiconductor devices (e.g., thyristors) and enabling fine-tuning of their operational characteristics. By layering materials along a fin (e.g., in an NPNP junction stack), thyristors and other semiconductor devices may be more compactly constructed than conventional planar devices. Traditional ion implantation techniques may not readily achieve the precision and dimensions desired for the junction stacking construction of the semiconductor device 100. Additionally, because no junction gaps need be arranged laterally in the substrate, the dimensions of the materials in the various portions and fins of the semiconductor device 100 may only be constrained by the minimum dimensions of conductive contacts that are to be positioned at select locations. This may enable aggressive scaling of the semiconductor device 100.

FIGS. 5-17 illustrate various stages in the fabrication of a semiconductor device, in accordance with some embodiments. Each of FIGS. 5-17 includes two cross-sectional depictions (A and B) of the associated stage in the fabrication of a semiconductor device, taken along the dashed lines. Although FIGS. 5-17 depict the fabrication of a single semiconductor device, the operations described below may be applied in parallel to an array of semiconductor devices on a substrate to achieve a desired density.

Referring to FIG. 5, an assembly 500 is shown. The assembly 500 may include a silicon wafer or other substrate material, such as any of the substrates discussed above with reference to the substrate 106.

Referring to FIG. 6, an assembly 600 is shown subsequent to forming a first fin 102 and a second fin 104 in the assembly 500. In some embodiments, the first fin 102 and the second fin 104 may be formed using any conventional fin formation technique. The first fin 102 and the second fin 104 may be formed on the substrate 106, and may be laterally separated by a distance 616. In some embodiments, the assembly 600 may be formed by removing material from the assembly 500 to leave behind the first fin 102 and the second fin 104. In some embodiments, the first fin 102 and the second fin 104 may be substantially monocrystalline, and may have the same crystal orientation as the substrate 106. Polycrystalline fin embodiments are also possible. The first fin 102 may have a side surface 808 and a top surface 606, and the second fin 104 may have a side surface 608 and a top surface 610.

Referring to FIG. 7, an assembly 700 is shown subsequent to depositing a dopant source film 702 on the assembly 600. The dopant source film 702 may be deposited conformally over the side surface 808 and the top surface 606 of the first fin 102, and over the side surface 608 and the top surface 610 of the second fin 104, and over intervening surfaces of the substrate 106. The deposition technique used to deposit the dopant source film 702 (as well as any of the dopant source films described herein) may depend on its composition; example techniques may include chemical vapor deposition (CVD), atomic layer deposition (ALD) and physical vapor deposition (PVD). The composition and thickness of the dopant source film 702 may vary depending upon the application. For example, in some embodiments, the dopant source film 702 may have a thickness of approximately 2 nanometers. In some embodiments, the dopant source film 702 may be conformal and uniformly doped. In some embodiments, the dopant source film 702 may be an N-type dopant, such as a phosphosilicate glass. In some embodiments, a thin layer of nitride (e.g., 3-5 nanometers in thickness) or another protective layer (e.g., silicon or an oxide) may be applied to the dopant source film 702 (or any of the dopant source films described herein) to act as an etch barrier. The etch barrier may facilitate the patterning/removal of a doped glass oxide. Some patterning techniques may not benefit from an etch barrier, and some may require an etch stop to protect the underlying layers of previously-formed patterned material.

Referring to FIG. 8, an assembly 800 is shown subsequent to patterning the dopant source film 702 of the assembly 700 to remove some of the dopant source film 702 to form a dopant source film 802. As shown in FIG. 8, the dopant source film 802 may be in contact with the second fin 104 and a region 804 of a side surface 808 of the first fin 102, and may not be in contact with a region 806 of the side surface 808. Any suitable patterning operation may be used to pattern the dopant source film 702 to form the dopant source film 802 (such as a tri-layer resist/recess scheme). Example patterning operations that may be used to pattern the dopant source film 702 (as well as any of the dopant source films described herein) are discussed below with reference to FIGS. 18-21.

Referring to FIG. 9, an assembly 900 is shown subsequent to depositing a dopant source film 902 on the assembly 800. The dopant source film 902 may be deposited conformally over the side surface 808 and the top surface 606 of the first fin 102, and over the side surface 608 and the top surface 610 of the second fin 104, and over intervening dopant source films and surfaces of the substrate 106. In some embodiments, a type of the dopant source film 902 may be different from a type of the dopant source film 802. For example, the dopant source film 902 may be a P-type dopant, and the dopant source film 802 may be an N-type dopant (or vice versa). The composition and thickness of the dopant source film 902 may vary depending upon the application. In some embodiments, the dopant source film 902 may be conformal and uniformly doped.

Referring to FIG. 10, an assembly 1000 is shown subsequent to patterning the dopant source film 902 of the assembly 900 to remove some of the dopant source film 902 to form a dopant source film 1002. As shown in FIG. 10, the dopant source film 1002 may be in contact with a region 1004 of the side surface 808 of the first fin 102, and may not be in contact with a region 1006 of the side surface 808. Additionally, the dopant source film 1002 may be in contact with a region 1008 of the top surface 606 of the first fin 102, and may not be in contact with a region 1010 of the top surface 606. The dopant source film 802 may be disposed between the dopant source film 1002 and the substrate 106.

Referring to FIG. 11, an assembly 1100 is shown subsequent to depositing a dopant source film 1102 on the assembly 1000. The dopant source film 1102 may be deposited conformally over the side surface 808 and the top surface 606 of the first fin 102, and over the side surface 608 and the top surface 610 of the second fin 104, and over intervening dopant source films and surfaces of the substrate 106. In some embodiments, a type of the dopant source film 1102 may be different from a type of the dopant source film 1002. For example, the dopant source film 1102 may be an N-type dopant, and the dopant source film 1002 may be a P-type dopant (or vice versa). In some embodiments, the dopant source films 802, 1002 and 1102 may be alternating in type (e.g., NPN or PNP). In some embodiments, the dopant source film 702 may be an N-type dopant, such as a phosphosilicate glass. The composition and thickness of the dopant source film 1102 may vary depending upon the application. In some embodiments, the dopant source film 1102 may be conformal and uniformly doped.

Referring to FIG. 12, an assembly 1200 is shown subsequent to patterning the dopant source film 1102 of the assembly 1100 to remove some of the dopant source film 1102 to form a dopant source film 1202. As shown in FIG. 12, the dopant source film 1202 may be in contact with a region 1204 of the side surface 808 of the first fin 102, and may not be in contact with a region 1206 of the side surface 808. Additionally, the dopant source film 1202 may be in contact with a region 1208 of the top surface 606 of the first fin 102, and may not be in contact with a region 1210 of the top surface 606. The dopant source film 1002 may be disposed between the dopant source film 1202 and the dopant source film 802.

Referring to FIG. 13, an assembly 1300 is shown subsequent to depositing a dopant source film 1302 on the assembly 1200. The dopant source film 1302 may be deposited conformally over the side surface 808 and the top surface 606 of the first fin 102, and over the side surface 608 and the top surface 610 of the second fin 104, and over intervening dopant source films and surfaces of the substrate 106. The dopant source film 1202 may be disposed between the dopant source film 1302 and the dopant source film 1002. In some embodiments, a type of the dopant source film 1302 may be different from a type of the dopant source film 1202. For example, the dopant source film 1302 may be a P-type dopant, and the dopant source film 1202 may be an N-type dopant (or vice versa). In some embodiments, the dopant source films 802, 1002, 1202 and 1302 may be alternating in type (e.g., NPNP or PNPN). The composition and thickness of the dopant source film 1302 may vary depending upon the application. In some embodiments, the dopant source film 1302 may be conformal and uniformly doped. As shown in FIG. 13B, the dopant source films 802, 1002, 1202 and 1302 may be concentrically layered around and on the first fin 102 and the second fin 104.

Referring to FIG. 14, an assembly 1400 is shown subsequent to performing a solid source diffusion technique to drive the dopants from the dopant source films 802, 1002, 1202 and 1302, into the first fin 102 and the second fin 104 of the assembly. Any suitable thermal process, such as a furnace drive or rapid thermal anneal, may be performed to achieve sufficient diffusion for dopants present in the dopant source films 802, 1002, 1202 and 1302 to permeate the entire lateral thickness of the first fin 102 and the second fin 104 (e.g., in the directions of the width 2206 and the lengths 2210 and 2212 of FIG. 22) without substantially diffusing in a vertical direction (e.g., in the direction of the height 2208 in FIG. 22). The tolerance to vertical diffusion in various applications may depend on the design and purpose of the semiconductor device 100. In some embodiments, it may be preferred to have sharp, well-defined junctions. Other embodiments may favor more diffusion to grade out the junction (for example, in a high voltage usage). The vertical diffusion may be constrained such that any intermediate layers are not "counterdoped," e.g., shunted to the layer above.

Temperature and time parameters may be selected based on various factors, such as the fin width (e.g., the width 2206 of FIG. 22), the desired fin doping concentration, and/or the dopant mobility within the dopant source films 802, 1002, 1202 and 1302 and/or the fins 102 and 104. In various embodiments, diffusion may be performed in a rapid thermal anneal ("RTA") or standard diffusion furnace, or any other controlled high temperature annealing tool. An example temperature range may be 800-1100 degrees Celsius and an example time range may be a few seconds to a few minutes for embodiments in which the fins 102 and 104 have a width (e.g., the width 2206 of FIG. 22) that is less than approximately 30 nanometers.

After the solid source diffusion technique has been applied, the first fin 102 may include a first portion 102a having a first material 108, a second material 110, a third material 112 and a fourth material 114, and a second portion 102b having a first material 220, a second material 222, and a third material 224. The second fin 104 may include a material 134. The material 134 may be materially contiguous with the first material 108. The first material 108 of the first portion 102a may be materially contiguous with the first material 220 of the second portion 102b. The second material 110 of the first portion 102a may be materially contiguous with the second material 222 of the second portion 102b. The third material 112 of the first portion 102a may be materially contiguous with the third material 224 of the second portion 102b.

As discussed above, in some embodiments, the assembly 1400 may be configured to form thyristor. In some such embodiments, the first material 108 may serve as an N-type cathode, the second material 110 may serve as a P-type gate, and the fourth material 114 may serve as a P-type anode.

Referring to FIG. 15, an assembly 1500 is shown subsequent to filling the lateral space 1406 between the annealed first fin 102 and the annealed second fin 104 (and any other lateral spaces between components disposed on the substrate 106) with an insulator 210, and also subsequent to planarizing the assembly 1400 to form a substantially planar surface 1502. In some embodiments, the insulator 210 may be a conventional isolation oxide. Planarizing the assembly 1400 may remove dopant source film above the planar surface 1502 (e.g., doped glass), which may provide a substantially planar surface to aid in further patterning.

Referring to FIG. 16, an assembly 1600 is shown subsequent to a fin recess process. For example, an oxide recess to expose active fins may be achieved, for example, through wet chemical etches (such as a hydrofluoric-based chemistry), or through conventional dry etching. Fin recess processes are commonly included in transistor fin architecture fabrication, and are not discussed further herein.

Referring to FIG. 17, an assembly 1700 is shown subsequent to forming a first conductive contact 212, a second conductive contact 214 and a third conductive contact 216 on the assembly 1600. In particular, the first conductive contact 212 may be formed on the material 134 of the second fin 104. The material 134 may be materially contiguous with the first material 108 of the first fin 102. The second conductive contact 214 may be formed on the fourth material 114 of the first portion 102a of the first fin 102. The third conductive contact 216 may be formed on the second material 222 of the second portion 102b of the first fin 102. The second material 222 of the second portion 102b may be materially contiguous with the second material 110 of the first portion 102a. As shown in the cross-sectional view of FIG. 17B, from the perspective of additional layers and devices being formed on top of the assembly 1700, the assembly 1700 takes the form of several conductive contacts emerging from a substantially planar surface, and thus has the appearance of a conventional transistor or SCR. Consequently, additional IC fabrication processes may be applied to the assembly 1700 to fabricate larger IC devices.

One or more of the fabrication operations illustrated in FIGS. 5-17 may be omitted or substituted with one or more alternate operations in various embodiments. For example, instead of forming the first material 108 by solid source diffusion from the dopant source film 802, the first material 108 may be formed using a deep retrograde implant technique. In some such embodiments, only the dopant source films 902, 1102 and 1302 may be deposited (after the implant). In another example, instead of forming the fourth material 114 by solid source diffusion from the dopant source film 1302, a source strain epitaxy technique may be used.

FIGS. 18-21 illustrate various stages in patterning operations in the fabrication of a semiconductor device, in accordance with some embodiments. For ease of explanation, FIGS. 18-21 depict patterning operations that may be performed to fabricate the assembly 800 (FIG. 8) from the assembly 700 (FIG. 7), but the operations discussed below with reference to FIGS. 18-21 may be applied to pattern any desired assembly. In particular, these operations may be applied to fabricate the assembly 1000 (FIG. 10) from the assembly 900 (FIG. 9), and/or the assembly 1200 (FIG. 12) from the assembly 1100 (FIG. 11).

Referring to FIG. 18, an assembly 1800 is shown subsequent to depositing a planarizing resist 1802 and a lithographic resist 1804 on the dopant source film 702 of the assembly 700 (FIG. 7). The planarizing resist 1802 is depicted as applied so as to be planarized at a level above the top surfaces 606 and 610 of the first fin 102 and the second fin 104, respectively. In some embodiments, the lithographic resist 1804 may include any conventional photoresist applied by conventional techniques, a carbon hardmask, or any other suitable material. The planarizing resist 1802 may be used to planarize the topography and enable better lithographic resolution. In some embodiments, no planarizing resist 1802 may be used. As discussed below, the lithographic resist 1804 may be used for mask/pattern transfer.

Referring to FIG. 19, an assembly 1900 is shown subsequent to patterning the lithographic resist 1804 to selectively remove some of the lithographic resist 1804 from the assembly 1800 to form the patterned lithographic resist 1902. The patterned lithographic resist 1902 may protect only the underlying portions of the planarizing resist 1802 in a subsequent etch operation.

Figure 20:
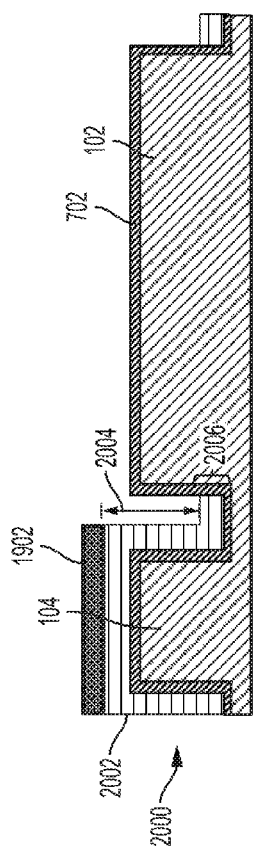

Referring to FIG. 20, an assembly 2000 is shown subsequent to etching the planarizing resist 1802 to selectively remove portions of the planarizing resist 1802 that are not coated by the Patterned lithographic resist 1902, thereby forming the patterned planarizing resist 2002. The patterned planarizing resist 2002 may protect only the underlying and adjacent portions of the dopant source film 702 in a subsequent etch operation. FIG. 20 depicts an embodiment in which the planarizing resist 1802 is etched to a depth 2004, leaving the patterned planarizing resist 2002 adjacent to a portion 2006 of the dopant source film 702.

Figure 21:
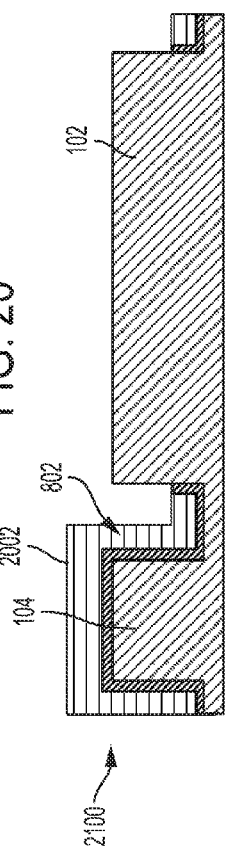

Referring to FIG. 21, an assembly 2100 is shown subsequent to etching the dopant source film 702 to selectively remove portions of the dopant source film 702 that are not coated by the patterned planarizing resist 2002, thereby forming the dopant source film 802. The patterned planarizing resist 2002 protects the portion 2006 of the dopant source film 702, while exposed portions of the dopant source film 702 are removed. Any suitable etch process may be used to etch the dopant source film 702, such as a wet oxide etch. The assembly 2100 is also depicted subsequent to the removal of the patterned lithographic resist 1902, which may be removed in the same etch process used to selectively remove portions of the dopant source film 702. Referring back to FIG. 8, the assembly 800 is shown subsequent to removing the patterned planarizing resist 2002 from the assembly 2100. The patterned planarizing resist 2002 may be removed using any suitable technique (e.g., an ash process).

Any conventional etch may be employed to etch the dopant source film 702, and the selection of a technique may depend on the composition of the dopant source film 702. Examples of conventional etch techniques include wet or dry dielectric etch. Any regions where the patterned planarizing resist 2002 left the dopant source film 702 exposed may be removed (e.g., from the side surface 808 of the first fin 102).

Figure 22:
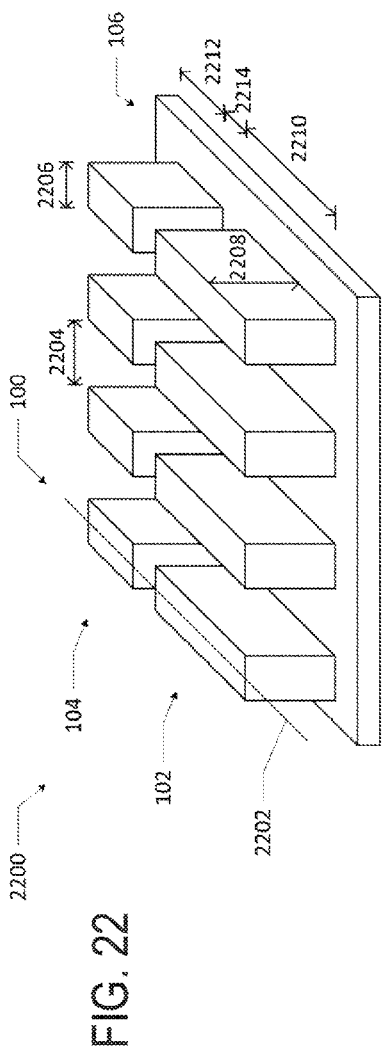
FIG. 22 is a perspective view of an array of a plurality of semiconductor devices arranged on a substrate, in accordance with some embodiments.

FIG. 22 is a perspective view of an array 2200 of a plurality of semiconductor devices 100 arranged on a substrate 106, in accordance with some embodiments. As shown in FIG. 22, each of the semiconductor devices 100 may include a first fin 102 and a second fin 104, and may be formed in accordance with any of the embodiments of the semiconductor devices 100 described herein. The plurality of semiconductor devices 100 may be regularly arranged within the array 2200, with the longitudinal axes 2202 of each semiconductor device 100 oriented substantially parallel. Other orientations and arrangements may be used; for example, the semiconductor devices 100 may be arranged so that not all of the first fins 102 are uniformly aligned, but are instead offset by any desired amount in the directions of the longitudinal axes 2202. Additionally, the semiconductor devices 100 need not be regularly spaced in the direction indicated by the arrow 2204, but may be irregularly spaced or have any desired spacing.

The dimensions of the semiconductor device 100 may vary as desired. In some embodiments, the first fin 102 and the second fin 104 have a width 2206 less than 50 nanometers, less than 30 nanometers, or less than 20 nanometers, for example. In some embodiments, the width 2206 may be between approximately 5 nanometers and approximately 15 nanometers. In some embodiments, the first fin 102 and the second fin 104 may have a height 2208 above the substrate 106 that is less than 200 nanometers, less than 150 nanometers, or between 20 nanometers and 150 nanometers, for example. In some embodiments, the height 2208 may be between approximately 50 nanometers and approximately 150 nanometers. In some embodiments, a length 2210 of the first fin 102, a length 2212 of the second fin 104, and a spacing 2214 between the first fin 102 and the second fin 104 may be a function of process capability and design choice. For example, in some embodiments, the spacing 2214 may be approximately 40 nanometers or greater.

FIG. 23 is a flow diagram of a method 2300 of fabricating a semiconductor device, in accordance with some embodiments. The operations of the method 2300 may be illustrated with reference to the semiconductor device 100 and the fabrication operations discussed above with reference to FIGS. 5-21 for illustrative purposes, but the method 2300 may be used to form any appropriate semiconductor device using any appropriate fabrication operations. Various operations are described herein as multiple discrete operations for ease of illustration. However, the order of description should not be construed as to imply that these operations are necessarily order dependent, or need be separated into discrete operations.

At the operation 2302, first and second fins may be formed on a substrate. For example, the first fin 102 and the second fin 104 (FIG. 6) may be formed on a substrate 106. The first and second fins may extend away from the substrate, and may be laterally separated. In some embodiments, the operation 2302 may not be performed, and instead, a substrate having first and second fins may be received as an input starting material.

At the operation 2304, a dopant source film may be formed in contact with a side surface of a portion of the first fin and/or the second fin. For example, the dopant source film 802 (FIG. 8) may be formed in contact with the region 804 of the side surface 808 of the first fin 102. The formation of the dopant source film at the operation 2304 may include depositing and patterning the dopant source film (e.g., as discussed above with reference to FIGS. 18-21). The dopant source film may be an N-type dopant or a P-type dopant, such as any of the dopants described herein. In some embodiments, the dopant source film formed at the operation 2304 may be a doped glass, such as any of the doped glasses described herein.

At the operation 2306, a determination may be made as to whether a desired number and arrangement of dopant source films has been formed on the first and/or second fin. If additional dopant source films are desired, the operation 2304 may be repeated to form an additional dopant source film in contact with a side surface of a portion of the first fin and/or the second fin. In various embodiments, the operation 2304 may be performed one, two, three, four or more times to form a corresponding number of dopant source films in any desired arrangement. For example, in some embodiments, a first dopant source film may be disposed in contact with a side surface of a portion of the first fin, in contact with the second fin, and between a second dopant source film and the substrate. In some embodiments, a second dopant source film may be disposed in contact with the side surface of the portion of the first fin and between a third dopant source film and a first dopant source film. In some embodiments, a third dopant source film may be disposed in contact with the side surface of the portion of the first fin and between a fourth dopant source film and a second dopant source film.

In some embodiments, the dopant included in the dopant source film formed at the operation 2304 may vary between dopant source films. In some embodiments, the type of dopant may alternate between p- and N-type between dopant source films in contact with each other. In some embodiments including four dopant source films, the first and third dopant source films may be formed from a dopant for a first type of extrinsic semiconductor, and the second and fourth dopant source films may be formed from a dopant for a second type of extrinsic semiconductor, the second type different from the first type.

The geometry of the dopant source film formed at the operation 2304 may vary between dopant source films. For example, in some embodiments including four dopant source films, the fourth dopant source film may be in contact with a top surface of the portion of the first fin. In some embodiments, the dopant source films formed by one or more iterations of the operation 2304 may form any of the dopant source filming geometries illustrated in FIGS. 1-21.

If, at the operation 2306, it is determined that no additional dopant source films are desired, the dopants from the dopant source film(s) may be driven into the portion of the first and/or second fins at the operation 2308. Any of the solid source diffusion techniques discussed herein may be applied at the operation 2308. The result of the operation 2308 may be the formation of various materials within the first and/or second fins. For example, in embodiments in which first, second, third and fourth dopant source films are formed at various iterations of the operation 2304 (as discussed above), dopants may be driven from these dopant source films into a portion of the first fin to form first, second, third and fourth materials (e.g., the first material 108, the second material 110, the third material 112 and the fourth material 114 of FIGS. 1-4), wherein: the first material is disposed between the second material and the substrate, the second material is disposed between the third material and the first material, and the third material is disposed between the fourth material and the second material. Examples of such embodiments are discussed herein with reference to FIGS. 1-21.

At the operation 2310, a conductive contact may be formed. The conductive contact may be formed on a portion of the first fin or the second fin into which a dopant has been driven. For example, in some embodiments, a conductive contact 214 may be formed on the fourth material 112, as shown in FIGS. 3, 4 and 17. A conductive contact 216 may be formed on a material 222 that is materially contiguous with the second material 110, as shown in FIGS. 3, 4 and 17.

At the operation 2312, a determination may be made as to whether a desired number and arrangement of conductive contacts has been formed on the first and/or second fin. If additional conductive contacts are desired, the operation 2310 may be repeated to form additional conductive contacts. For example, a conductive contact may be formed on a material 134 of the second fin 104 that is materially contiguous with the first material 108 of the first fin 102.

FIG. 25 is a cross-sectional view of a portion of an IC device 2500 including one or more semiconductor devices 100 in the device layer 2518, in accordance with some embodiments. The IC device 2500 may be formed on a substrate 2504. The substrate 2504 may be a semiconductor substrate composed of semiconductor material systems including, for example, N-type or P-type materials systems. The substrate 2504 may include, for example, a crystalline substrate formed using a bulk silicon or a silicon-on-insulator substructure, and may serve as the substrate 106 of FIGS. 1-4. Although a few examples of materials from which the substrate 2504 may be formed are described here, any material that may serve as a foundation upon which the IC device 2500 may be constructed may be used in accordance with various embodiments.

In some embodiments, the IC device 2500 may include a device layer 2518 disposed on the substrate 2504. The device layer 2518 may include features of one or more semiconductor devices 2508 formed on the substrate 2504. The semiconductor device 2508 may include one or more semiconductor devices 100, which may be arranged in an array (such as the array 2200 of FIG. 22) or in any other arrangement. In some embodiments, the semiconductor devices 2508 may include one or more semiconductor devices 100 configured as thyristors, as discussed above. These thyristors may be included in electrical discharge protection circuitry, for example. The semiconductor device 2508 may also include a wide variety of other types and configurations of semiconductor devices such as, for example, planar and non-planar transistors such as dual- or double-gate transistors, tri-gate transistors, planar SCRs and all-around gate (AAG) or wrap-around gate transistors (e.g., FinFETs). In some embodiments, the device layer 2518 may include one or more transistors or memory cells of a logic device or a memory device, or combinations thereof.

Electrical signals such as, for example, power and/or input/output (I/O) signals may be routed to and/or from the semiconductor devices 2508 of the device layer 2518 through one or more interconnect layers 2520 and 2522 disposed on the device layer 2518. For example, electrically conductive features of the device layer 2518 such as, for example, one or more of the conductive contacts 212, 214 and 216 of the semiconductor device 100 (FIGS. 3-4), may be electrically coupled with the interconnect structures 2516 of the interconnect layers 2520 and 2522. The one or more interconnect layers 2520 and 2522 may form an interlayer dielectric stack of the IC device 2500. The interconnect structures 2516 may be configured within the interconnect layers 2520 and 2522 to route electrical signals according to a wide variety of designs and is not limited to the particular configuration of interconnect structures 2516 depicted in FIG. 25.

For example, in some embodiments, the interconnect structures 2516 may include trench structures (sometimes referred to as "lines") and/or via structures (sometimes referred to as "holes") filled with an electrically conductive material such as a metal. In some embodiments, the interconnect structures 2516 may comprise copper or another suitable electrically conductive material.

The interconnect layers 2520 and 2522 may include a dielectric layer 2524 disposed between the interconnect structures 2516, as can be seen. The dielectric layer 2524 may include any conventional dielectric materials, arranged as desired.

In some embodiments, a first interconnect layer 2520 (referred to as Metal 1 or "M1") may be formed directly on the device layer 2518. In some embodiments, the first interconnect layer 2520 may include some of the interconnect structures 2516, which may be coupled with contacts (e.g., the conductive contacts 212, 214 and 216 of the semiconductor device 100 (FIGS. 3-4)) of the device layer 2518.

Additional interconnect layers (not shown for ease of illustration) may be formed directly on the first interconnect layer 2520, and may include interconnect structures 2516 to couple with interconnect structures of the first interconnect layer 2520.

The IC device 2500 may one or more bond pads 2526 formed on the interconnect layers 2520 and 2522. The bond pads 2526 may be electrically coupled with the interconnect structures 2516 and configured to route the electrical signals of the semiconductor devices 2508 to other external devices. For example, solder bonds may be formed on the one or more bond pads 2526 to mechanically and/or electrically couple a chip including the IC device 2500 with another component such as a circuit board. The IC device 2500 may have other alternative configurations to route the electrical signals from the interconnect layers 2520 and 2522 than depicted in other embodiments. In other embodiments, the bond pads 2526 may be replaced by or may further include other analogous features (e.g., posts) that route the electrical signals to other external components.

Figure 26:
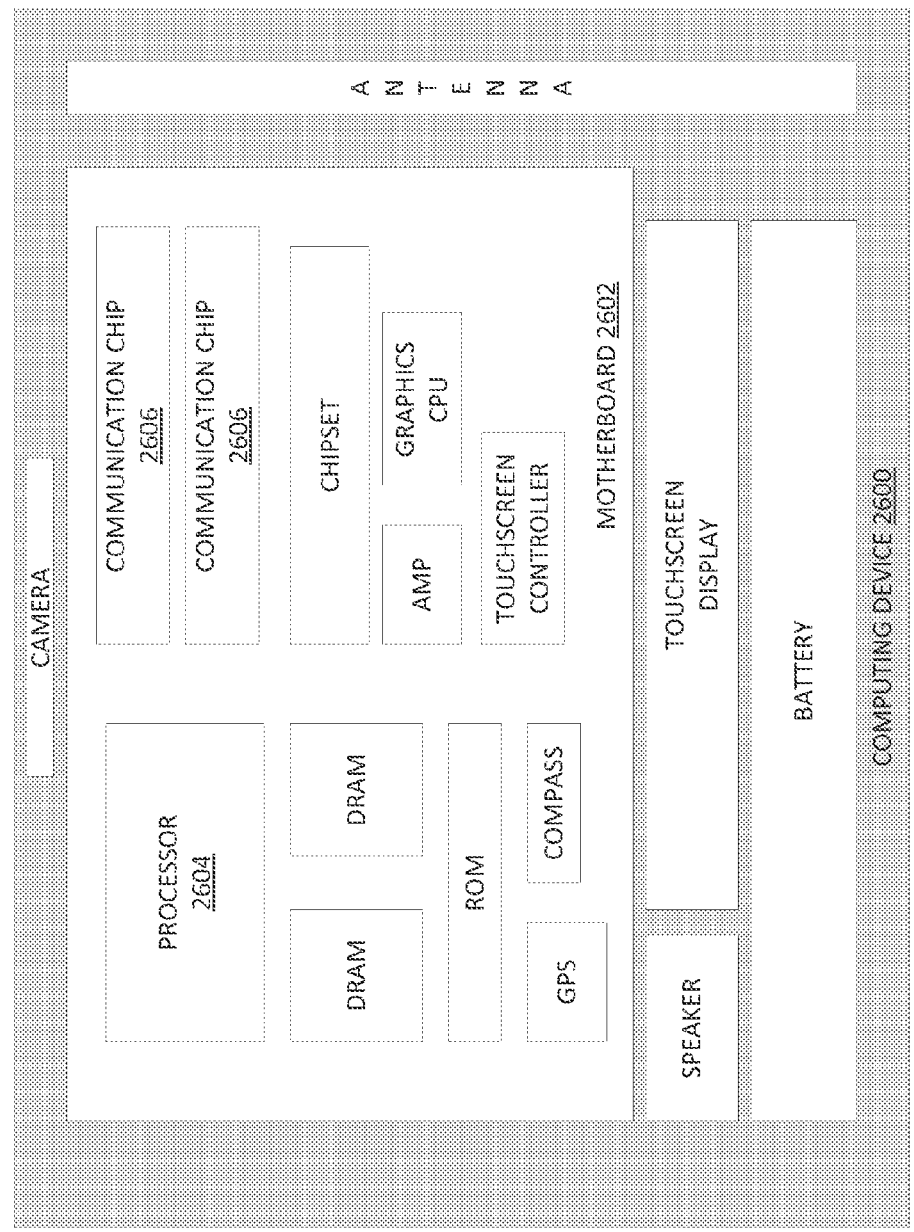
FIG. 26 is a block diagram of a computing device that may include a semiconductor device, in accordance with some embodiments.

Embodiments of the present disclosure may be implemented into a system using any suitable hardware and/or software to configure as desired. FIG. 26 schematically illustrates a computing device 2600 in accordance with one implementation. In some embodiments, one or more of the semiconductor devices disclosed herein may be used (e.g., as a thryistor) in one or more components of the computing device 2600.

The computing device 2600 may house a board such as motherboard 2602. The motherboard 2602 may include a number of components, including but not limited to a processor 2604 and at least one communication chip 2606. The processor 2604 may be physically and electrically coupled to the motherboard 2602. In some implementations, the at least one communication chip 2606 may also be physically and electrically coupled to the motherboard 2602. In further implementations, the communication chip 2606 may be part of the processor 2604. The term "processor" may refer to any device or portion of a device that processes electronic data from registers and/or memory to transform that electronic data into other electronic data that may be stored in registers and/or memory.

Depending on its applications, the computing device 2600 may include other components that may or may not be physically and electrically coupled to the motherboard 2602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device such as hard disk drive, compact disk (CD), digital versatile disk (DVD), and so forth).

The communication chip 2606 may enable wireless communications for the transfer of data to and from the computing device 2600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2606 may implement any of a number of wireless standards or protocols, including but not limited to institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as 3GPP2), etc.), IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 2606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 2606 may operate in accordance with other wireless protocols in other embodiments.

The computing device 2600 may include a plurality of communication chips 2606. For instance, a first communication chip 2606 may be dedicated to shorter range wireless communications such as Wi-Fi and Bluetooth and a second communication chip 2606 may be dedicated to longer range wireless communications such as GPS, EDGE, GPRS, CDMA, WiMAX, LTE, Ev-DO, and others. In some embodiments, two or more longer range wireless communication protocols may be supported by the computing device 2600 for use in data or voice communication.

The communication chip 2606 may also include an IC device that may include a semiconductor device (e.g., the semiconductor device 100) as described herein. In further implementations, another component (e.g., memory device or other IC device) housed within the computing device 2600 may contain one or more semiconductor devices as described herein.

In various implementations, the computing device 2600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2600 may be any other electronic device that processes data. In some embodiments, the techniques described herein are implemented in a high-performance computing device. In some embodiments, the techniques described herein are implemented in handheld computing devices.

The following paragraphs identify various examples of the embodiments disclosed herein. Example 1 is a semiconductor device, including a first fin and a second fin disposed on a substrate. The first fin includes first, second, third and fourth materials, wherein the first material is disposed between the second material and the substrate, the second material is disposed between the third material and the first material, the third material is disposed between the fourth material and the second material, the first and third materials are formed from a first type of extrinsic semiconductor, and the second and fourth materials are formed from a second type of extrinsic semiconductor, the second type different from the first type. The second fin is laterally separated from the first fin, and has a material that is materially contiguous with at least one of the first, second, third or fourth materials.

Example 2 may include the subject matter of Example 1, and may further specify that the first type of extrinsic semiconductor is one of an N-type and a P-type, and that the second type of extrinsic semiconductor is an N-type if the first type of extrinsic semiconductor is a P-type, or a P-type if the first type of extrinsic semiconductor is an N-type.

Example 3 may include the subject matter of any of Examples 1-2, further including a first conductive contact disposed on the fourth material.

Example 4 may include the subject matter of Example 3, and may further specify that the first fin has a first portion and a second portion, the first, second, third and fourth materials of the first fin are included in the first portion, the second portion includes first and second materials, the first material of the second portion is materially contiguous with the first material of the first portion, the second material of the second portion is materially contiguous with the second material of the first portion, and the semiconductor device further includes a second conductive contact disposed on the second material of the second portion.

Example 5 may include the subject matter of Example 4, and may further specify that the first conductive contact is disposed on a first surface of the fourth material of the first portion, the second conductive contact is disposed on a second surface of the second material of the second portion, and the first and second surfaces are substantially in the same plane.

Example 6 may include the subject matter of any of Examples 4-5, and may further specify that the fourth material of the first portion and the second material of the second portion are laterally separated by a material that is materially contiguous with the third material of the first portion.

Example 7 may include the subject matter of any of Examples 4-6, and may further include a third conductive contact disposed on the second fin.

Example 8 may include the subject matter of any of Examples 1-7, and may further specify that the second fin is laterally separated from the first fin by an insulator.

Example 9 may include the subject matter of any of Examples 1-8, and may further specify that the semiconductor device is a thyristor.

Example 10 may include the subject matter of any of Examples 1-9, and may further specify that the material of the second fin is materially contiguous with the first material.

Example 11 is a method of fabricating a semiconductor device, including: forming first and second fins on a substrate, the first and second fins extending away from the substrate and laterally separated; and forming first, second, third and fourth dopant source films of first, second, third and fourth dopants, respectively, in contact with a side surface of a portion of a first fin. The first dopant source film is disposed in contact with a side surface of a portion of the first fin, in contact with the second fin, and between the second dopant source film and the substrate, the second dopant source film is disposed in contact with the side surface of the portion of the first fin and between the third dopant source film and the first dopant source film, the third dopant source film is disposed in contact with the side surface of the portion of the first fin and between the fourth dopant source film and the second dopant source film, the first and third dopant source films include a dopant for a first type of extrinsic semiconductor, and the second and fourth dopant source films include dopant for a second type of extrinsic semiconductor, the second type different from the first type.

Example 12 may include the subject matter of Example 11, and may further specify that the fourth dopant source film is in contact with a top surface of the portion of the first fin.

Example 13 may include the subject matter of any of Examples 11-12, and may further include driving dopants from the first, second, third and fourth dopant source films into the portion of the first fin to form first, second, third and fourth materials, wherein the first material is disposed between the second material and the substrate, the second material is disposed between the third material and the first material, the third material is disposed between the fourth material and the second material, the first and third materials are formed from the first type of extrinsic semiconductor, and the second and fourth materials are formed from the second type of extrinsic semiconductor.

Example 14 may include the subject matter of Example 13, and may further include: forming a first conductive contact on the fourth material; and forming a second conductive contact on a material that is materially contiguous with the second material.

Example 15 may include the subject matter of Example 14, and may further include forming a third conductive contact on a material of the second fin that is materially contiguous with the first material.

Example 16 may include the subject matter of any of Examples 14-15, and may further specify that the first, second, third and fourth materials are included in a thyristor.

Example 17 may include the subject matter of any of Examples 11-16, and may further specify that the first, second, third or fourth dopants include a doped glass.

Example 18 is an integrated circuit device, including: a silicon substrate; an interconnect layer including interconnect structures and an interlayer dielectric; and one or more semiconductor devices, disposed between the silicon substrate and the interconnect layer. Each of the one or more semiconductor devices includes: a first fin and a second fin disposed on the silicon substrate. The first fin includes first, second, third and fourth materials, wherein: the first material is disposed between the second material and the silicon substrate, the second material is disposed between the third material and the first material, the third material is disposed between the fourth material and the second material, the first and third materials are formed from a first type of extrinsic semiconductor, and the second and fourth materials are formed from a second type of extrinsic semiconductor, the second type different from the first type. The second fin is laterally separated from the first fin, and has a material that is materially contiguous with at least one of the first, second, third or fourth materials.

Example 19 may include the subject matter of Example 18, and may further specify that the one or more semiconductor devices is included in electrostatic discharge protection circuitry.

Example 20 may include the subject matter of Example 19, and may further specify that the electrostatic discharge protection circuitry includes a high voltage clamp.

Example 21 may include the subject matter of any of Examples 18-20, and may further specify that: the one or more semiconductor devices includes a plurality of semiconductor devices; the arrangement of the first and second fins of an individual semiconductor device define an axis; and the plurality of axes corresponding to the plurality of semiconductor devices are substantially parallel.

Example 22 may include the subject matter of Examples 18-21, and may further specify that at least one of the one or more semiconductor devices is a thyristor.

What is claimed is:

1. A semiconductor device, comprising:
   a first fin located on a substrate, the first fin comprising a first material, a second material, a third material, and a fourth material, wherein the first fin has a first portion and a second portion, wherein the first portion includes the first material, the second material, the third material, and the fourth material, wherein the second portion includes the first material and the second material, wherein the first material of the second portion is materially contiguous with the first material of the first portion, wherein the second material of the second portion is materially contiguous with the second material of the first portion, and wherein:
      the first material is located between the second material and the substrate,
      the second material is located between the third material and the first material,
      the third material is located between the fourth material and the second material,
      the first material and the third material include a first type of extrinsic semiconductor, and
      the second material and the fourth material include a second type of extrinsic semiconductor, the second type different from the first type; and
   a second fin located on the substrate, laterally separated from the first fin, wherein the second fin has a material that is materially contiguous with at least one of the first material, the second material, the third material, or the fourth material;
   a first conductive contact located on the fourth material; and
   a second conductive contact located on the second material of the second portion.

2. The semiconductor device of claim 1, wherein the first type of extrinsic semiconductor is one of an N-type and a P-type, and wherein the second type of extrinsic semiconductor is an N-type if the first type of extrinsic semiconductor is a P-type, or a P-type if the first type of extrinsic semiconductor is an N-type.

3. The semiconductor device of claim 1, wherein the first conductive contact is located on a first surface of the fourth material of the first portion, the second conductive contact is located on a second surface of the second material of the second portion, and the first surface and the second surface are substantially in a same plane.

4. The semiconductor device of claim 1, wherein the fourth material of the first portion and the second material of the second portion are laterally separated by a material that is materially contiguous with the third material of the first portion.

5. The semiconductor device of claim 1, further comprising a third conductive contact located on the second fin.

6. The semiconductor device of claim 1, wherein the second fin is laterally separated from the first fin by an insulator.

7. The semiconductor device of claim 1, wherein the semiconductor device is a thyristor.

8. The semiconductor device of claim 1, wherein the material of the second fin is materially contiguous with the first material.

9. A method of fabricating a semiconductor device, comprising:
   forming first and second fins on a substrate, the first and second fins extending away from the substrate and laterally separated; and
   forming first, second, third and fourth dopant source films of first, second, third and fourth dopants, respectively, in contact with a side surface of a portion of the first fin, wherein:
      the first dopant source film is located in contact with a side surface of a portion of the first fin, in contact with the second fin, and between the second dopant source film and the substrate,
      the second dopant source film is located in contact with the side surface of the portion of the first fin and between the third dopant source film and the first dopant source film,
      the third dopant source film is located in contact with the side surface of the portion of the first fin and between the fourth dopant source film and the second dopant source film,
      the first and third dopant source films include a dopant for a first type of extrinsic semiconductor, and
      the second and fourth dopant source films include a dopant for a second type of extrinsic semiconductor, the second type different from the first type.

10. The method of claim 9, wherein the fourth dopant source film is in contact with a top surface of the portion of the first fin.

11. The method of claim 9, further comprising:
driving dopants from the first, second, third and fourth dopant source films into the portion of the first fin to form first, second, third and fourth materials, wherein:
the first material is located between the second material and the substrate,
the second material is located between the third material and the first material,
the third material is located between the fourth material and the second material,
the first and third materials are formed from the first type of extrinsic semiconductor, and
the second and fourth materials are formed from the second type of extrinsic semiconductor.

12. The method of claim 11, further comprising:
forming a first conductive contact on the fourth material; and
forming a second conductive contact on a material that is materially contiguous with the second material.

13. The method of claim 12, further comprising:
forming a third conductive contact on a material of the second fin that is materially contiguous with the first material.

14. The method of claim 12, wherein the first, second, third and fourth materials are included in a thyristor.

15. The method of claim 9, wherein the first, second, third or fourth dopants comprise a doped glass.

16. An integrated circuit device, comprising:
a silicon substrate;
an interconnect layer comprising interconnect structures and an interlayer dielectric; and
one or more semiconductor devices, located between the silicon substrate and the interconnect layer, each of the one or more semiconductor devices comprising:
a first fin located on the silicon substrate, the first fin comprising a first material, a second material, a third material, and a fourth material, wherein the first fin has a first portion and a second portion, wherein the first portion includes the first material, the second material, the third material, and the fourth material, wherein the second portion includes the first material and the second material, wherein the first material of the second portion is materially contiguous with the first material of the first portion, wherein the second material of the second portion is materially contiguous with the second material of the first portion, and wherein:
the first material is located between the second material and the silicon substrate,
the second material is located between the third material and the first material,
the third material is located between the fourth material and the second material,
the first material and the third material are formed from a first type of extrinsic semiconductor, and
the second material and the fourth material are formed from a second type of extrinsic semiconductor, the second type different from the first type,
a second fin located on the silicon substrate, laterally separated from the first fin, wherein the second fin has a material that is materially contiguous with at least one of the first material, the second material, the third material, or the fourth material;
a first conductive contact located on the fourth material; and
a second conductive contact located on the second material of the second portion.

17. The integrated circuit device of claim 16, wherein the one or more semiconductor devices is included in electrostatic discharge protection circuitry.

18. The integrated circuit device of claim 17, wherein the electrostatic discharge protection circuitry includes a high voltage clamp.

19. The integrated circuit device of claim 16, wherein:
the one or more semiconductor devices comprises a plurality of semiconductor devices;
an arrangement of the first fin and the second fin of an individual semiconductor device define an axis; and
a plurality of axes corresponding to the plurality of semiconductor devices are substantially parallel.

20. The integrated circuit device of claim 16, wherein at least one of the one or more semiconductor devices is a thyristor.

* * * * *